United States Patent
Kim et al.

(10) Patent No.: US 7,998,782 B2
(45) Date of Patent: Aug. 16, 2011

(54) FABRICATION OF IMAGE SENSOR WITH IMPROVED SIGNAL TO NOISE RATIO

(75) Inventors: Jin-Ho Kim, Seoul (KR); Chang-Rok Moon, Seoul (KR); Seung-Hun Shin, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/454,818

(22) Filed: May 22, 2009

(65) Prior Publication Data

US 2010/0227429 A1 Sep. 9, 2010

(30) Foreign Application Priority Data

Jun. 19, 2008 (KR) .................. 10-2008-0058047

(51) Int. Cl.
*H01L 21/8238* (2006.01)
(52) U.S. Cl. .................. 438/73; 257/E27.064
(58) Field of Classification Search .................. None
See application file for complete search history.

(56) References Cited

U.S. PATENT DOCUMENTS

2006/0105489 A1* 5/2006 Rhodes .................. 438/48

OTHER PUBLICATIONS

Korean Patent Publication No. 1020060124888 to Ko, having Publication date of Dec. 6, 2006 (w/ English Abstract page).
Korean Patent Publication No. 1020070049411 to Lee, having Publication date of May 11, 2007 (w/ English Abstract page).
Korean Patent Publication No. 1020070050666 to Huh et al., having Publication date of May 16, 2007 (w/ English Abstract page).

* cited by examiner

*Primary Examiner* — Thao P. Le
(74) *Attorney, Agent, or Firm* — Monica H. Choi

(57) ABSTRACT

For fabricating an image sensor, an isolation structure is formed to define a first active region of a semiconductor substrate. A first transistor and a second transistor of a unit pixel are formed in the first active region. In addition, a threshold voltage lowering region is formed in a portion of the semiconductor substrate near a portion of the isolation structure abutting the second transistor in the first active region. The threshold voltage lowering region causes the second transistor to have a respective threshold voltage magnitude that is lower than for the first transistor. The threshold voltage lowering region is formed simultaneously with a passivation region in a second active region having a photodiode formed therein.

20 Claims, 20 Drawing Sheets

FABRICATION OF IMAGE SENSOR WITH IMPROVED SIGNAL TO NOISE RATIO

BACKGROUND OF THE INVENTION

This application claims priority under 35 USC §119 to Korean Patent Application No. 10-2008-0058047, filed on Jun. 19, 2008 in the Korean Intellectual Property Office, the disclosure of which is incorporated herein in its entirety by reference.

1. Field of the Invention

The present invention relates generally to image sensors, and more particularly to fabrication of a complementary metal-oxide semiconductor (CMOS) image sensor having an improved spatial signal to noise ratio (SNR).

2. Background of the Invention

An image sensor converts an optical image into electrical signals. Image sensors are now widely used in electronic devices such as digital cameras, camcorders, personal computer (PC) systems, game devices, security cameras, medical micro cameras, or robots due to recent developments in the computer and communication industries.

An image sensor is classified as one of a charge coupled device (CCD) image sensor or a complementary metal-oxide semiconductor (CMOS) image sensor. Generally, a CMOS image sensor has simple operations and is compatible with CMOS process technology for reduced manufacturing cost.

A CMOS image sensor may be implemented with various types of structures. For example, a CMOS image sensor may be implemented with each unit pixel having four transistors for each photodiode. Each photodiode converts received light into an amount of electric charge corresponding to the intensity of the received light. A transfer transistor transmits the accumulated electric charge from the photodiode to a floating diffusion region. When a select transistor is turned on, a drive transistor configured as a source follower amplifier outputs a voltage in response to an electric potential at the floating diffusion region.

For improved display quality of the CMOS image sensor, a high spatial signal to noise ratio (SNR) is desired. For improving the SNR, a respective threshold voltage of the select transistor is desired to be lower than a respective threshold voltage of the drive transistor. If the threshold voltage of the select transistor is higher than the threshold voltage of the drive transistor, the output signal from the drive transistor is disadvantageously reduced resulting in reduced gain and reduced spatial SNR.

In addition, the select transistor and the drive transistor of the CMOS image sensor are manufactured according to general CMOS fabrication processes. In the prior art, a channel ion implantation is performed for simultaneously determining the threshold voltages of the select transistor and the drive transistor. Accordingly, the select transistor and the drive transistor typically have same threshold voltages in the prior art.

FIG. 13A shows a plot of an output voltage Vout and a gain with respect to an input voltage Vin of a conventional image sensor having a select transistor and a drive transistor with the same threshold voltages such as Vth1. Further in FIG. 13A, as the input voltage Vin is increased, the output voltage Vout is increased according to a first curve V11 corresponding to a first gain curve G11.

Alternatively, if the select transistor and the drive transistor have same threshold voltages Vth2 lower than Vth1, as the input voltage Vin is increased, the output voltage Vout is increased according to a second curve V12 corresponding to a second gain curve G12. In that case in FIG. 13A, the gain curve G12 is widened at the lower region of the voltages Vin and Vout but not at the higher region of the voltages Vin and Vout. Accordingly, the spatial signal to noise ratio (SNR) is not increased significantly.

However, a CMOS image sensor having increased spatial signal to noise ratio (SNR) is desired with low manufacturing cost of the CMOS image sensor.

SUMMARY OF THE INVENTION

Accordingly, an image sensor is formed to have improved spatial SNR by lowering a magnitude of a respective threshold voltage of the select transistor to be less than a magnitude of a respective threshold voltage of the drive transistor without an additional implantation step in the CMOS fabrication process.

For fabricating an image sensor according to an aspect of the present invention, an isolation structure is formed to define a first active region of a semiconductor substrate. A first transistor and a second transistor of a unit pixel are formed in the first active region. In addition, a threshold voltage lowering region is formed in the semiconductor substrate near a portion of the isolation structure abutting the second transistor in the first active region. The threshold voltage lowering region causes the second transistor to have a respective threshold voltage magnitude that is lower than for the first transistor.

In an example embodiment of the present invention, the first transistor is a drive transistor, and the second transistor is a select transistor, of the unit pixel.

In another embodiment of the present invention, a dopant is implanted for forming the threshold voltage lowering region in the semiconductor substrate near the portion of the isolation structure abutting the select transistor. In addition, an implantation mask is formed such that the dopant is not implanted in the semiconductor substrate near a portion of the isolation structure abutting the drive transistor.

In a further embodiment of the present invention, the dopant is a P-type dopant when the drive transistor and the select transistor are NMOSFETs (N-channel metal oxide semiconductor field effect transistors). Alternatively, the dopant is an N-type dopant when the drive transistor and the select transistor are PMOSFETs (P-channel metal oxide semiconductor field effect transistors).

In another embodiment of the present invention, the isolation structure is formed to also define a second active region of the semiconductor substrate. A photo conversion device of the unit pixel is formed in the second active region. A passivation region is formed in the semiconductor substrate near a portion of the isolation structure abutting the second active region.

In an aspect of the present invention, the passivation region is formed simultaneously with the threshold voltage lowering region. For example, the passivation region and the threshold voltage lowering region are formed simultaneously from the same implantation of the dopant.

In a further embodiment of the present invention, a channel dopant is implanted into channels of the select transistor and the drive transistor separately from the implantation of the dopant for forming the threshold voltage lowering region.

In another embodiment of the present invention, a respective gate insulator and a respective gate electrode are formed over each of the channels of the select transistor and the drive transistor. In addition, drain/source regions are formed beside the channels of the select transistor and the drive transistor.

The present invention may be used to particular advantage when the image sensor is a CMOS (complementary metal oxide semiconductor) image sensor. However, embodiments of the present invention may be used with other types of image sensors.

In this manner, the magnitude of the respective threshold voltage of the select transistor is lower than the magnitude of the respective threshold voltage of the drive transistor for increasing spatial signal to noise ratio (SNR) by formation of the threshold voltage lowering region. In addition, the threshold voltage lowering region is formed simultaneously during formation of the passivation region such that an additional mask/implantation step is not used to form the threshold voltage lowering region for low manufacturing cost.

BRIEF DESCRIPTION OF THE DRAWINGS

The above and other features and advantages of the present invention will become more apparent when described in detailed exemplary embodiments thereof with reference to the attached drawings in which.

Figure 1A:
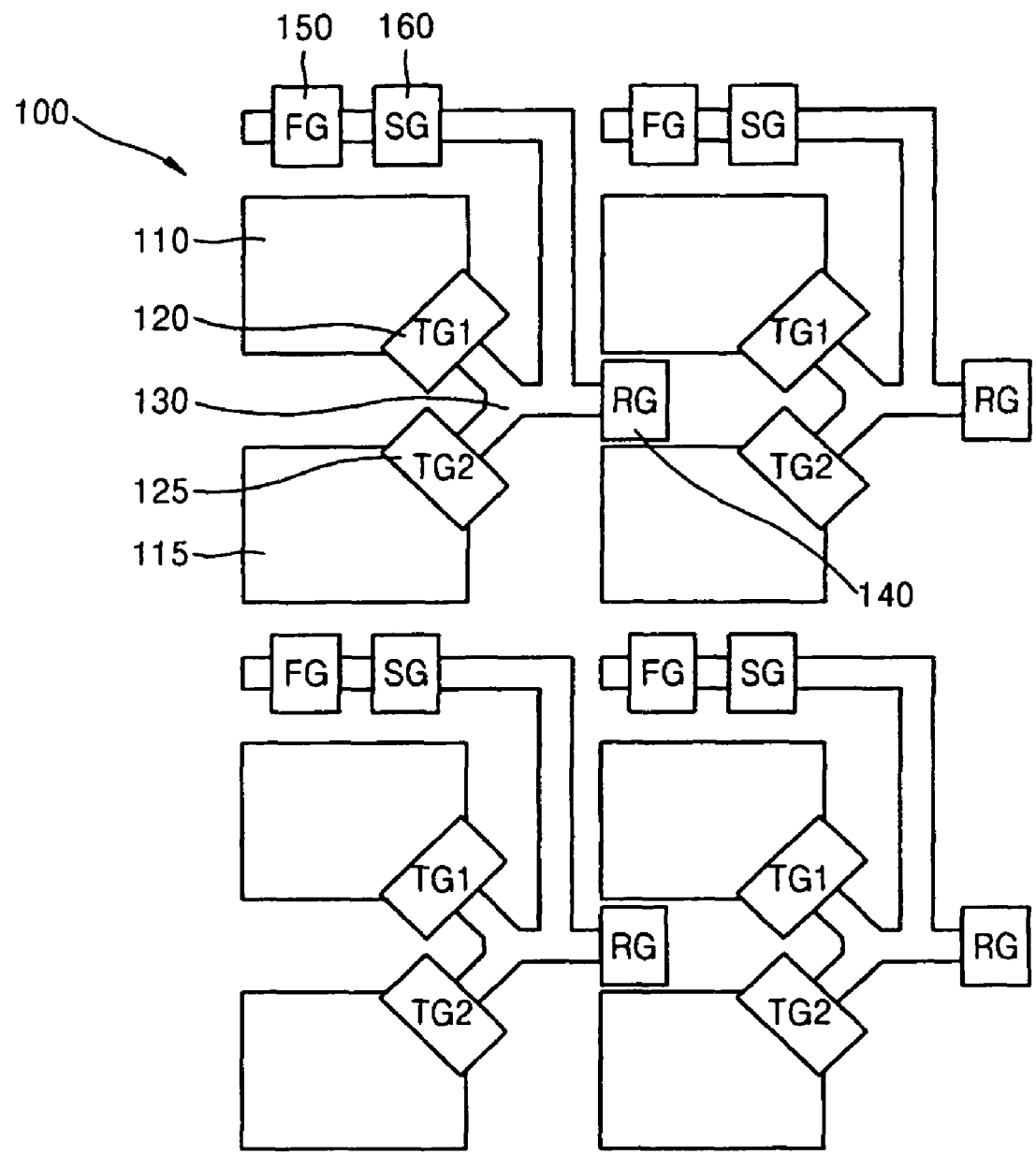
FIG. 1A is a plan view showing unit pixels of an image sensor, according to an embodiment of the present invention.

The figures referred to herein are drawn for clarity of illustration and are not necessarily drawn to scale.

Elements having the same reference number in FIGS. 1A, 1B, 2A, 2B, 2C, 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 100, 11A, 11B, 11C, 12A, 12B, 12C, 13A, and 13B refer to elements having similar structure and/or function.

DETAILED DESCRIPTION OF THE INVENTION

The present invention is now described more fully with reference to the accompanying drawings, in which exemplary embodiments of the invention are shown. The present invention may, however, be embodied in many different forms and should not be construed as being limited to the embodiments set forth herein. Rather, these embodiments are provided so that this disclosure will be thorough and complete, and will fully convey the concepts of the invention to one skilled in the art. In the drawings, like reference numerals denote like elements, and the sizes and thicknesses of layers and regions are exaggerated for clarity.

Figure 1B:
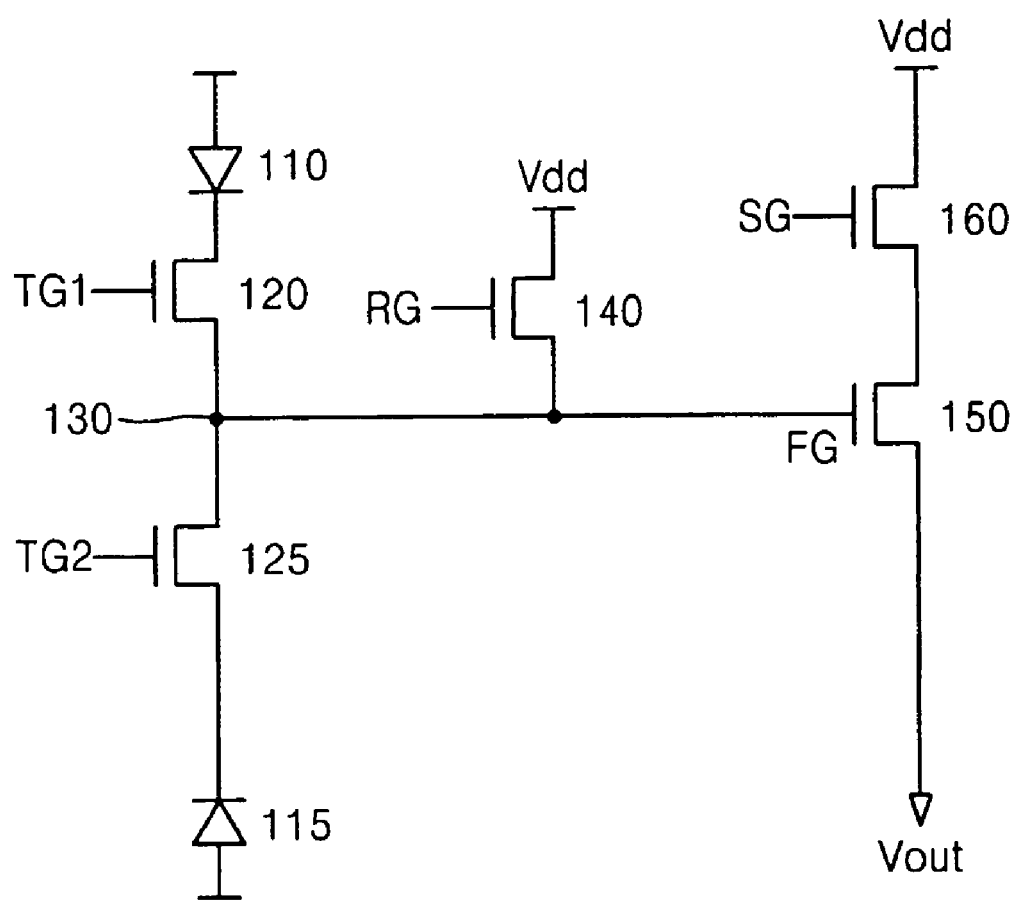
FIG. 1B is a circuit diagram of an example unit block in the image sensor of FIG. 1A, according to an embodiment of the present invention.

FIG. 1A is a plan view showing unit pixels of an image sensor, according to an embodiment of the present invention. FIG. 1B shows a circuit diagram of an example unit block in the image sensor of FIG. 1A.

Referring to FIGS. 1A and 1B, the image sensor includes a plurality of unit blocks 100. Each unit block 100 includes two unit pixels with two photodiodes 110 and 115, and a floating diffusion region 130 shared by the photodiodes 110 and 115. Each of the photodiodes 110 and 115 is an example photo conversion device for converting received light into electric charge. Each photodiode accumulates an amount of electric charge corresponding to an intensity of the received light. The floating diffusion region 130 accumulates the electric charge transmitted from each of the photodiodes 110 and 115.

In addition, each unit block 100 further includes first and second transfer transistors 120 and 125, a reset transistor 140, a drive transistor 150, and a select transistor 160. A first charge transmission signal TG1 is applied at a respective gate of the first transfer transistor 120, and a second charge transmission signal TG2 is applied at a respective gate of the second transfer transistor 125. A reset control signal RG is applied at a respective gate of the reset transistor 140. A row select signal SG is applied at a respective gate of the select transistor 160.

The first and second transfer transistors 120 and 125 are connected between the photodiodes 110 and 115, respectively, and the floating diffusion region 130. The reset transistor 140 is connected between a power voltage source Vdd and the floating diffusion region 130. The drive transistor 150 has a gate connected to the floating diffusion region 130, and has a drain and a source connected between the select transistor 160 and an output terminal Vout. The select transistor 160 is connected between the drive transistor 150 and the power voltage source Vdd.

Each of the photodiodes 110 and 115 generates respective electric charge according to a respective intensity of received light. The first and second transfer transistors 120 and 125 transmits respective electric charge from the photodiodes 110 and 115, respectively, to the floating diffusion region 130 in response to the control signals TG1 and TG2, respectively.

The drive transistor 150 is configured as a source follower amplifier to generate an output voltage signal Vout in response to the electric charge stored in the floating diffusion region 130. The select transistor 160 selectively turns on the drive transistor 150 to provide the output voltage signal Vout in response to the row select signal SG. The reset transistor 140 periodically resets the floating diffusion region 130 in response to the reset control signal RG. In the image sensor of FIGS. 1A and 1B according to an embodiment of the present invention, the select transistor 160 is formed to have a respective threshold voltage with a magnitude that is lower than a magnitude of a respective threshold voltage of the drive transistor 150.

FIGS. 2A, 3A, 4A, 5A, 6A, 7A, 8A, 9A, 10A, 11A, and 12A are plan views during fabrication of a portion of the image sensor of FIG. 1B, according to an embodiment of the present invention. FIGS. 2B, 3B, 4B, 5B, 6B, 7B, 8B, 9B, 10B, 11B, and 12B are cross-sectional views along line B-B of FIGS. 2A, 3A, 4A, 5A, 6A, 7A, 8A, 9A, 10A, 11A, and 12A, respectively, according to an embodiment of the present invention. FIGS. 2C, 3C, 4C, 5C, 6C, 7C, 8C, 9C, 10C, 11C, and 12C are cross-sectional views taken along the line C-C of FIGS. 2A, 3A, 4A, 5A, 6A, 7A, 8A, 9A, 10A, 11A, and 12A, respectively, according to an embodiment of the present invention.

Such figures show fabrication of the photodiodes 110 and 115, the select transistor 160, and the drive transistor 150. The drive transistor 150 and the select transistor 160 are fabricated as depletion mode NMOSFETs (N-channel metal oxide semiconductor field effect transistors) in an example embodiment of the present invention.

Figure 2A:
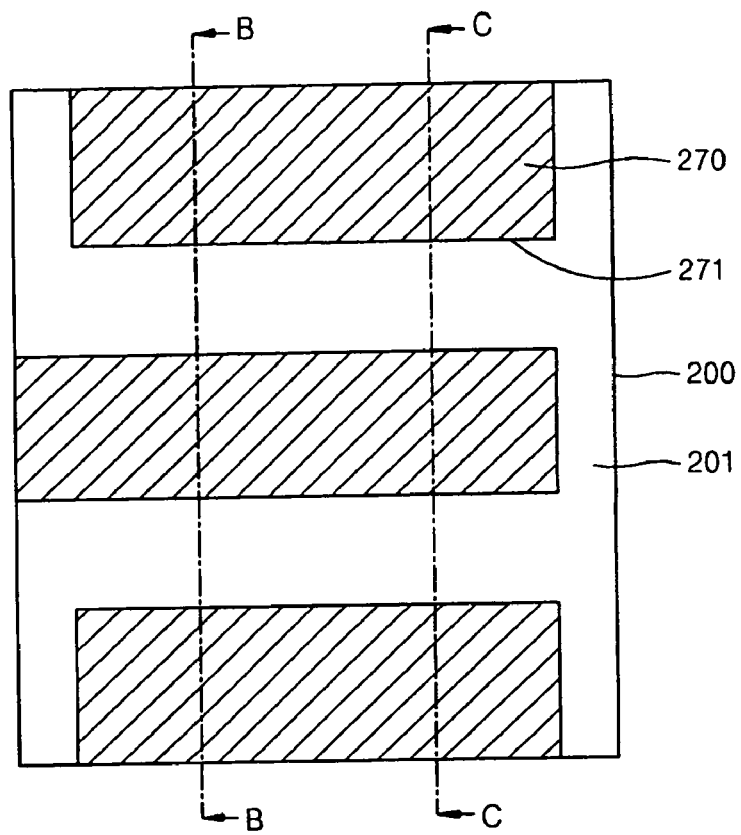
FIGS. 2A, 3A, 4A, 5A, 6A, 7A, 8A, 9A, 10A, 11A, and 12A are plan views during fabrication of a portion of the image sensor of FIG. 1B, according to an embodiment of the present invention.
Figure 2B:
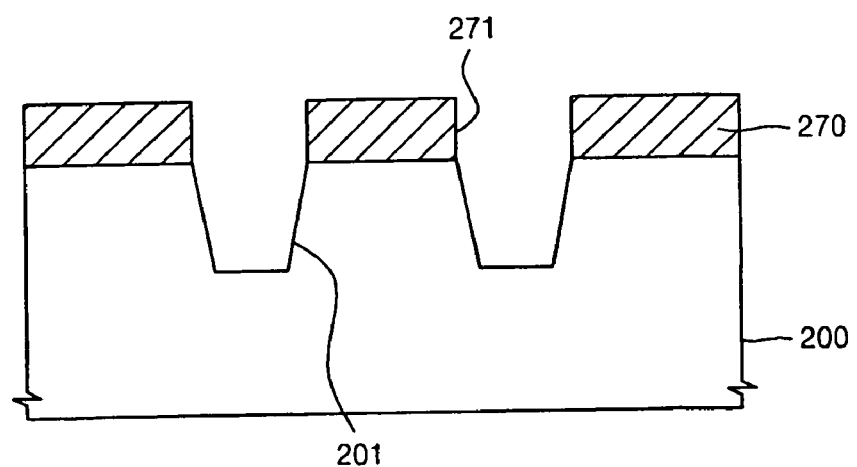
FIGS. 2B, 3B, 4B, 5B, 6B, 7B, 8B, 9B, 10B, 11B, and 12B are cross-sectional views along line B-B of FIGS. 2A, 3A, 4A, 5A, 6A, 7A, 8A, 9A, 10A, 11A, and 12A, respectively, according to an embodiment of the present invention.
Figure 2C:
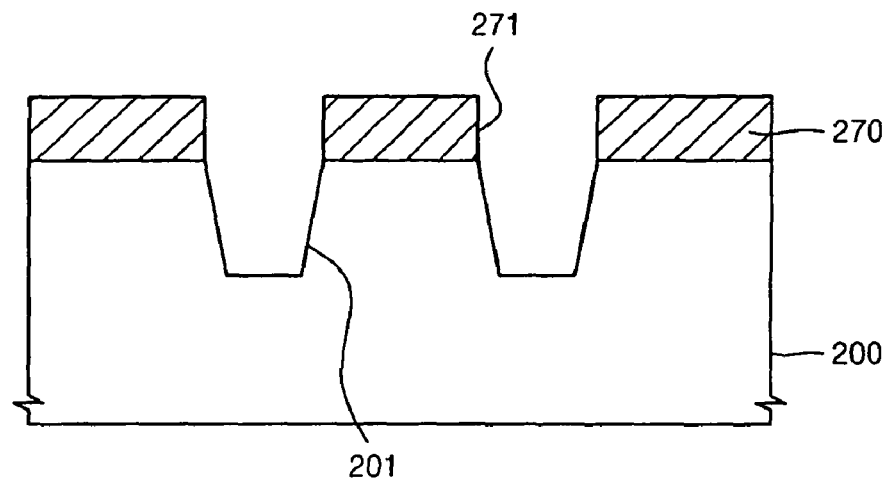
FIGS. 2C, 3C, 4C, 5C, 6C, 7C, 8C, 9C, 10C, 11C, and 12C are cross-sectional views taken along the line C-C of FIGS. 2A, 3A, 4A, 5A, 6A, 7A, 8A, 9A, 10A, 11A, and 12A, respectively, according to an embodiment of the present invention.

Referring to FIGS. 2A, 2B, and 2C, a first photosensitive film 270 is deposited and patterned on a semiconductor substrate 200 to form first openings 271 that expose portions of the semiconductor substrate 200. The exposed portions of the semiconductor substrate 200 are etched using the first photosensitive film 270 as an etching mask to form trenches 201 in the semiconductor substrate 200. The semiconductor substrate 200 is a P-type doped silicon substrate in an example embodiment of the present invention for forming the drive transistor 150 and the select transistor 160 as NMOSFETs.

Figure 3A:
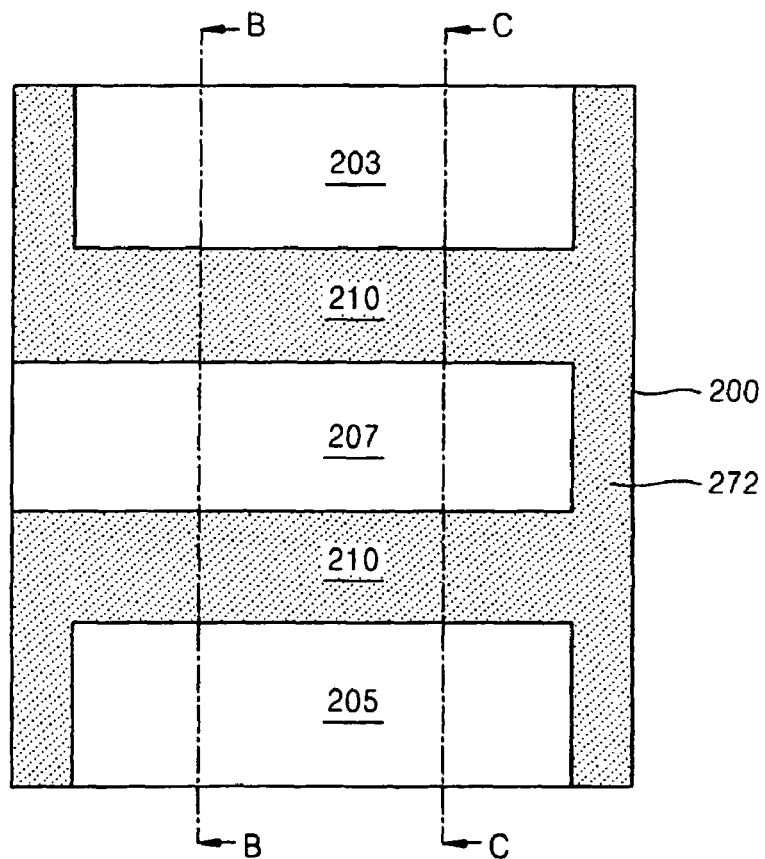
Figure 3B:
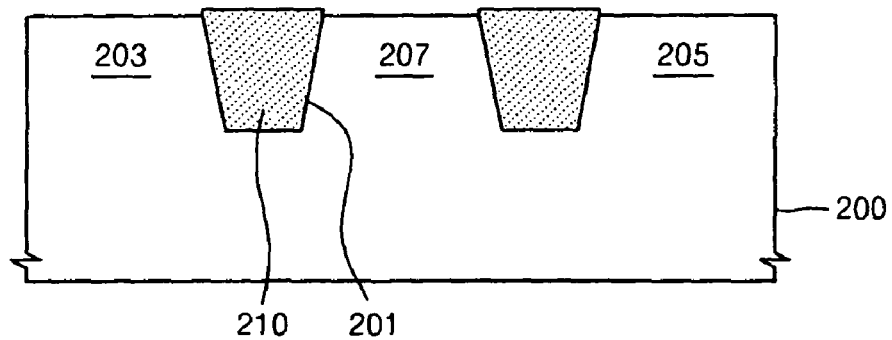
Figure 3C:
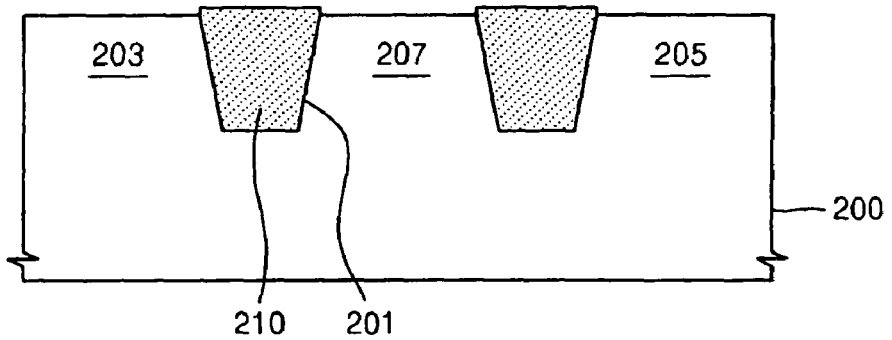

Referring to FIGS. 3A, 3B, and 3C, the first photosensitive film 270 is removed, and then an insulator film (not illustrated) is formed for filling the trenches 201 in the semiconductor substrate 200. For example, the insulator film may include an oxidation film.

Such insulator film is then polished down by a chemical mechanical polishing (CMP) process. A device isolation structure 210 is formed from portions of the insulator film remaining in the trenches 201. The device isolation structure 210 defines a first active region 203, a second active region 205, and a third active region 207 of the semiconductor substrate 200.

The first active region 203 is for having the photodiode 110 fabricated therein, and the second active region 205 is for having the photodiode 115 fabricated therein. The third active region 207 disposed between the first and second active regions 203 and 205 is for having transistors such as the select transistor 160 and the drive transistor 150 for example fabricated therein.

Figure 4A:
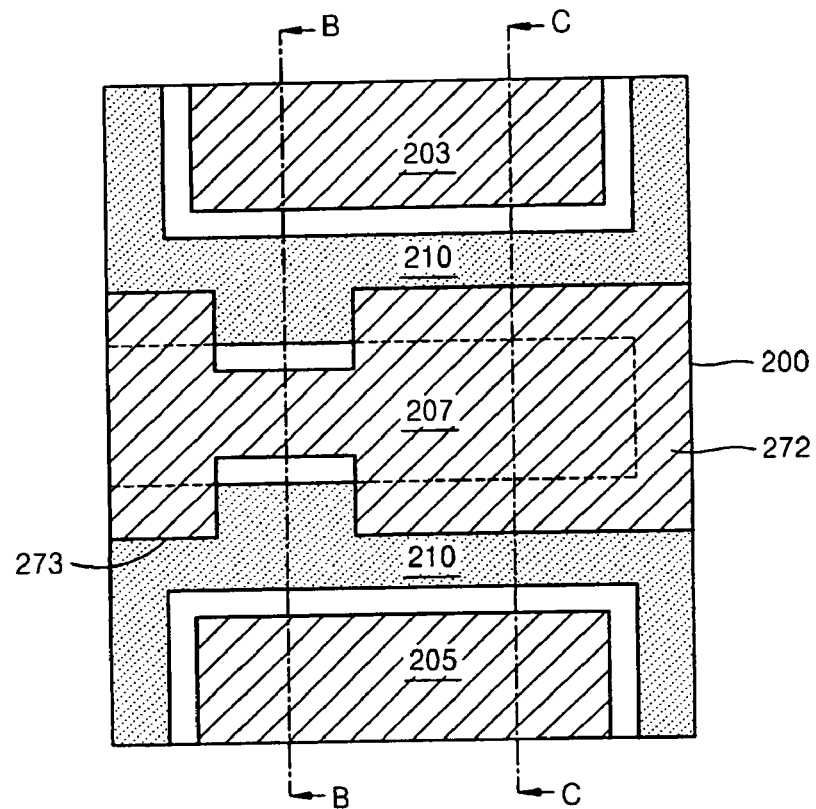
Figure 4B:
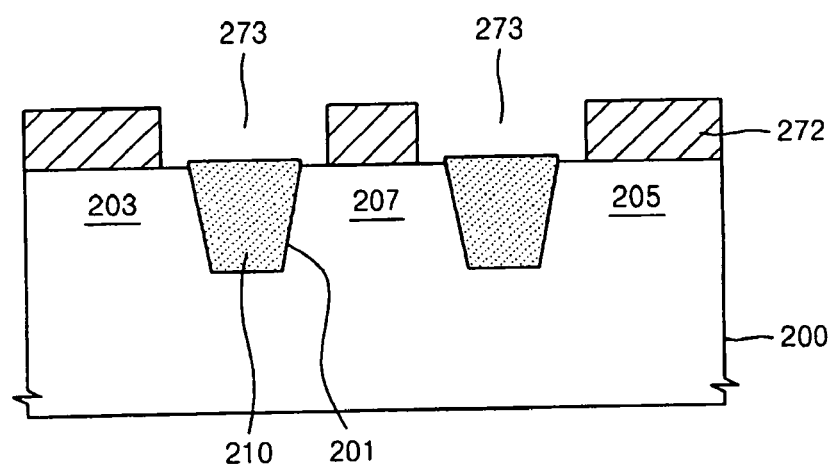
Figure 4C:
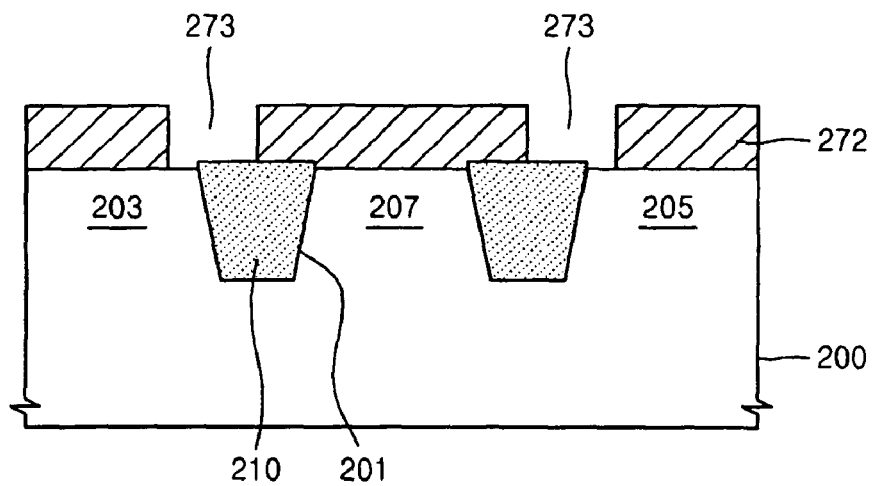

Referring to FIGS. 4A, 4B, and 4C, a second photosensitive film 272 is deposited and patterned on the semiconductor substrate 200 to form second openings 273. The openings 273 expose portions of the first and second active regions 203 and 205 abutting the device isolation structure 210. The openings 273 also expose portions of the top surfaces of the device isolation structure 210 and portions of the third active region 207 abutting a portion of the device isolation structure 210 near the select transistor 160.

Figure 5A:
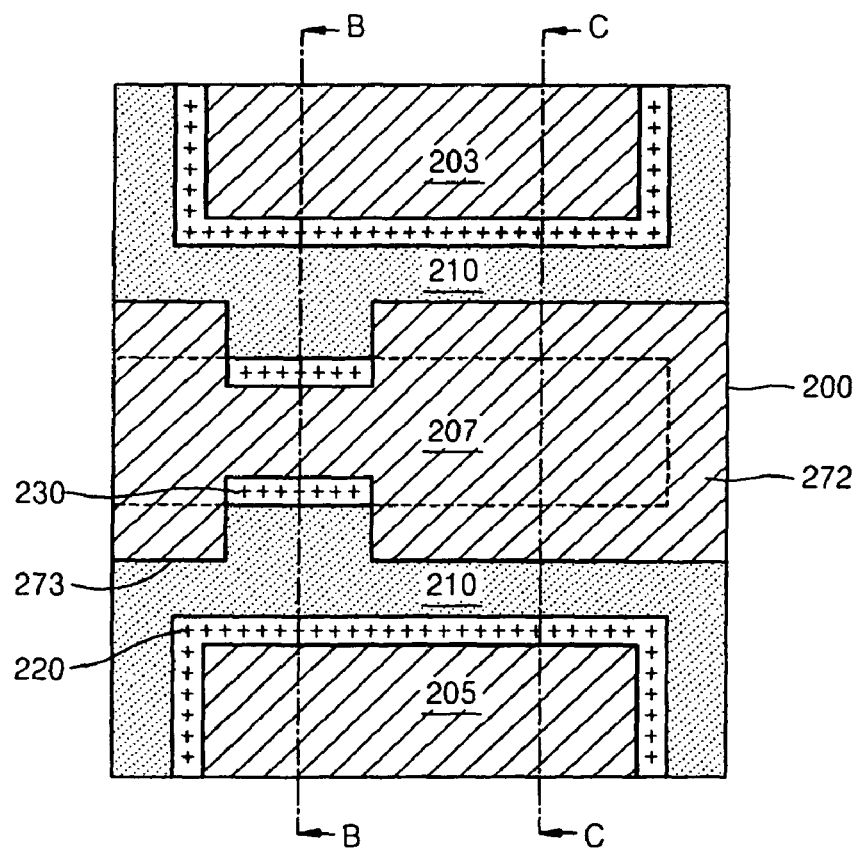
Figure 5B:
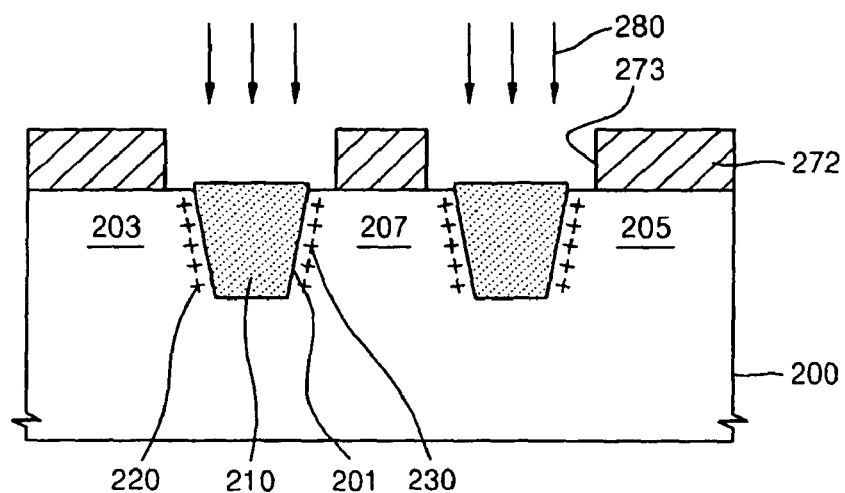
Figure 5C:
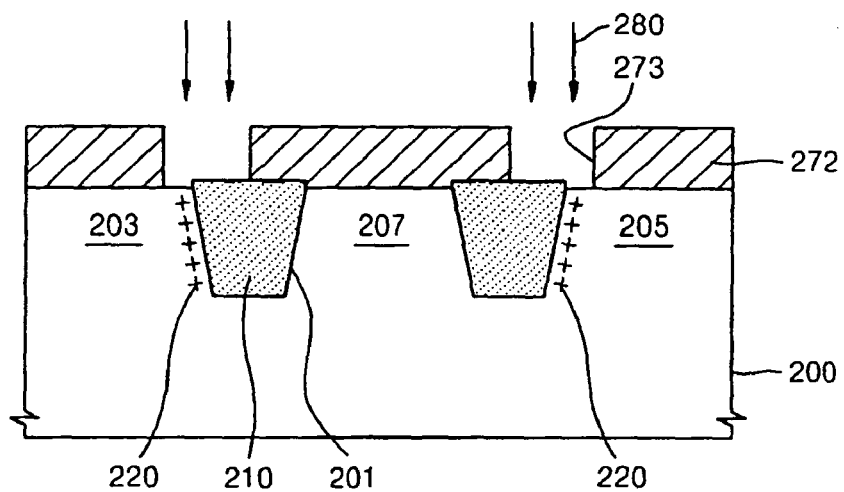

Referring to FIGS. 5A, 5B, and 5C, the second photosensitive film 272 is used as an implantation mask during an implantation process for implanting a dopant 280 into exposed portions of the first, second, and third active regions 203, 205, and 207. Such an implantation dopant 280 is a P-type dopant when the drive transistor 150 and the select transistor 160 are fabricated as NMOSFETs. The present invention may also be practiced with the implantation dopant 280 being an N-type dopant when the drive transistor 150 and the select transistor 160 are fabricated as PMOSFETs (P-channel metal oxide semiconductor field effect transistors).

From such an implantation, passivation regions 220 are formed at portions of the first and second active regions 203 and 205 abutting the device isolation structure 210. In addition, such an implantation results in a threshold voltage lowering region 230 at portions of the third active region 207 abutting the device isolation structure 210.

During formation of the device isolation structure 210, dangling and/or broken bonds may be formed at the walls of the trenches 201 from stress and/or damage of the semiconductor substrate 200. The passivation regions 220 prevent and/or minimize the flow of leakage current from such dangling and/or broken bonds.

Figure 6A:
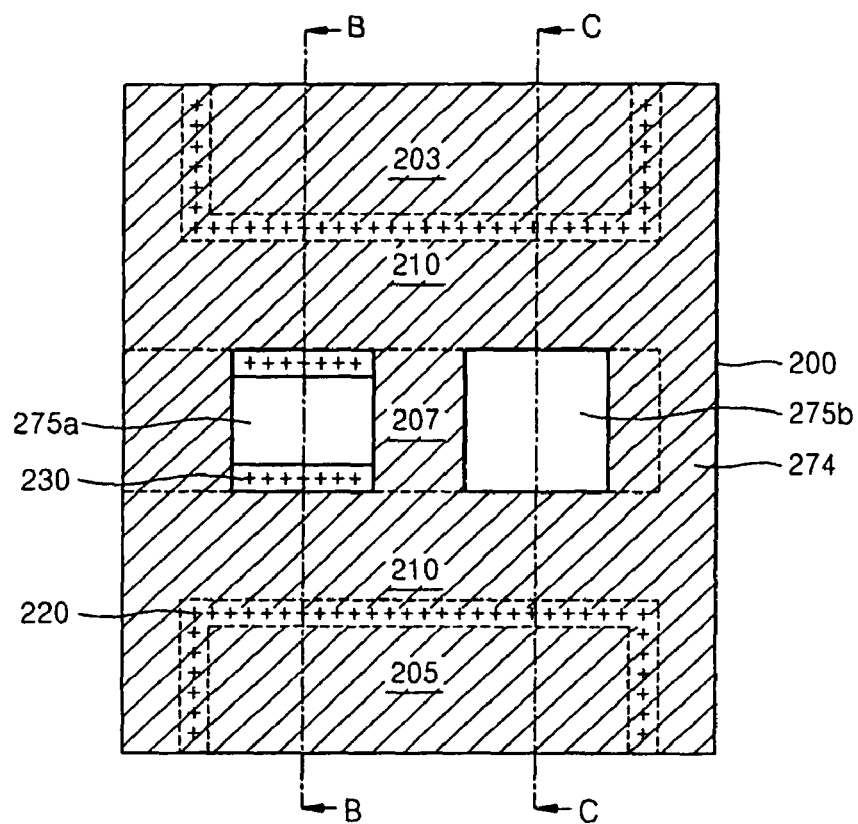
Figure 6B:
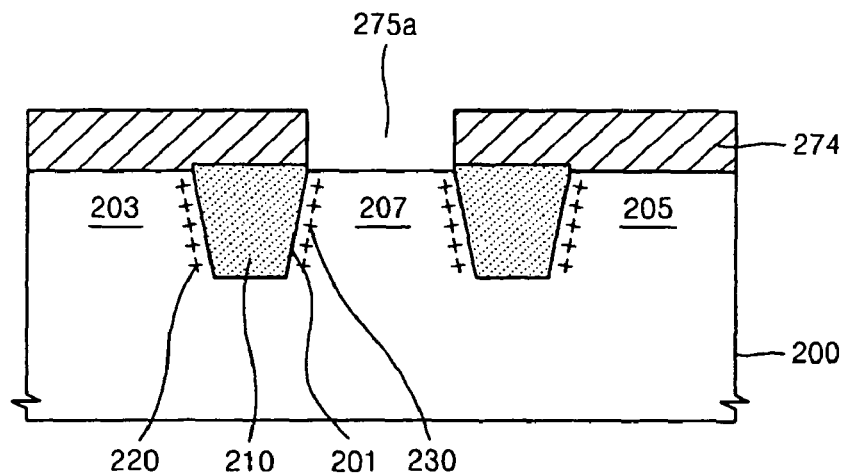
Figure 6C:
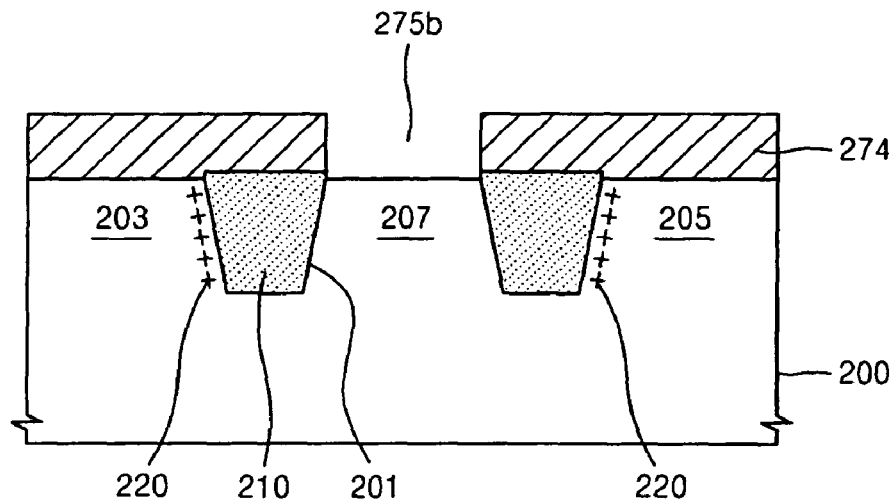

Referring to FIGS. 6A, 6B, and 6C, the second photosensitive film 272 is removed, and then a third photosensitive film 274 is deposited and patterned on the semiconductor substrate 200. The third photosensitive film 274 is patterned to form third openings 275a and 275b which expose portions of the third active region 207 for forming channel regions of the select transistor 160 and the drive transistor 150, respectively.

Figure 7A:
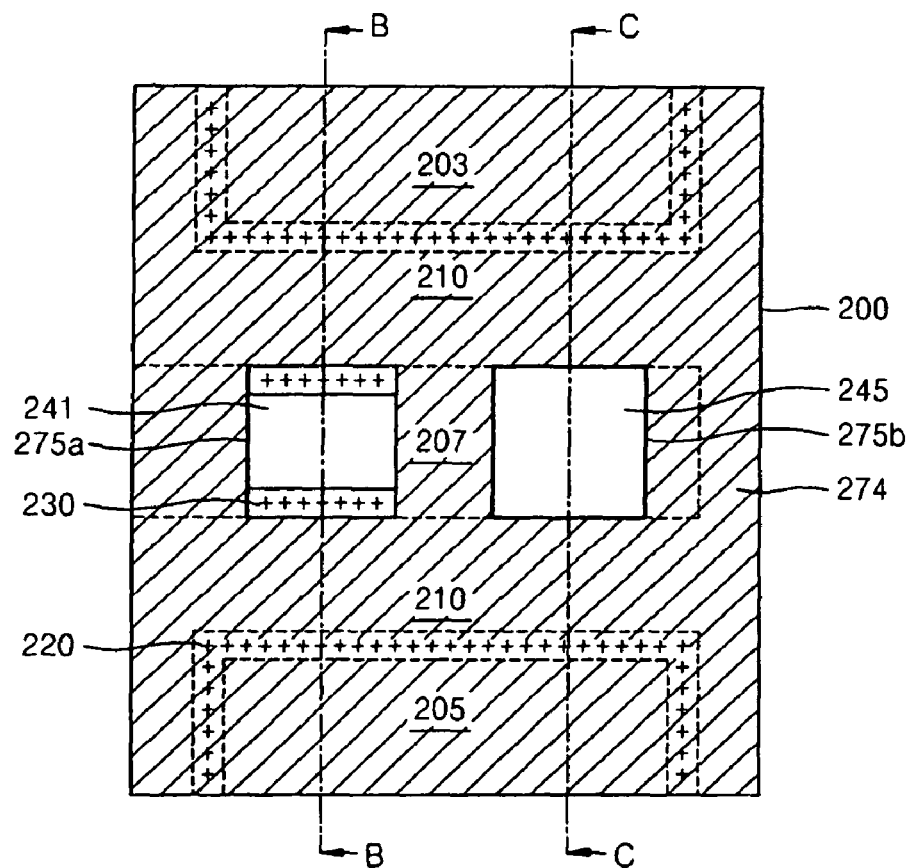
Figure 7B:
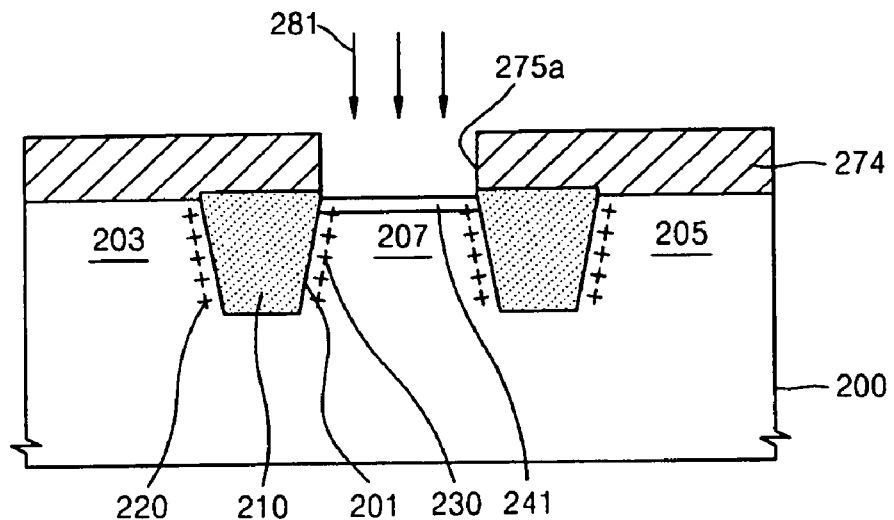
Figure 7C:
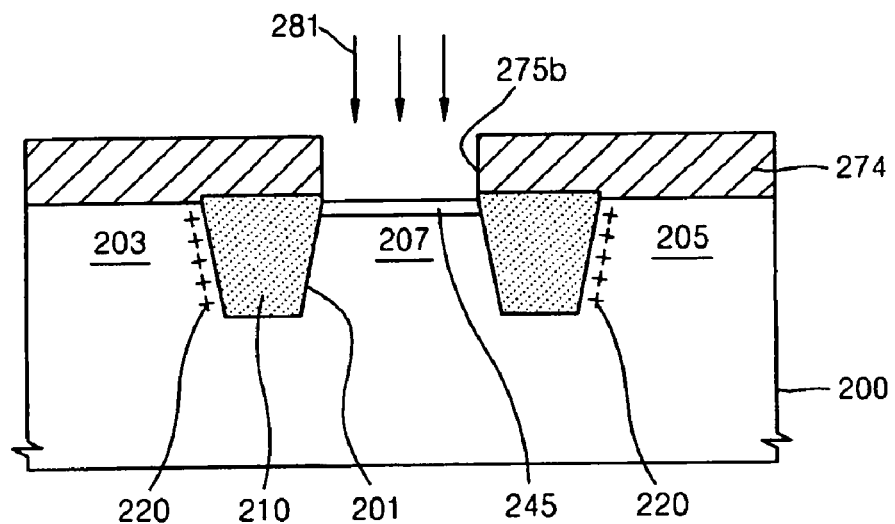

Referring to FIGS. 7A, 7B, and 7C, using the third photosensitive film 274 as an implantation mask, exposed portions of the third active region 207 are implanted with a P-type channel dopant 281 to form a respective channel ion implantation layer 241 for the select transistor 160 and a respective channel ion implantation layer 245 for the drive transistor 150. The P-type dopant 281 is used when the drive transistor 150 and the select transistor 160 are fabricated as NMOSFETs. The present invention may also be practiced with an N-type dopant being used instead in FIGS. 7A, 7B, and 7C when the drive transistor 150 and the select transistor 160 are fabricated as PMOSFETs.

Figure 8A:
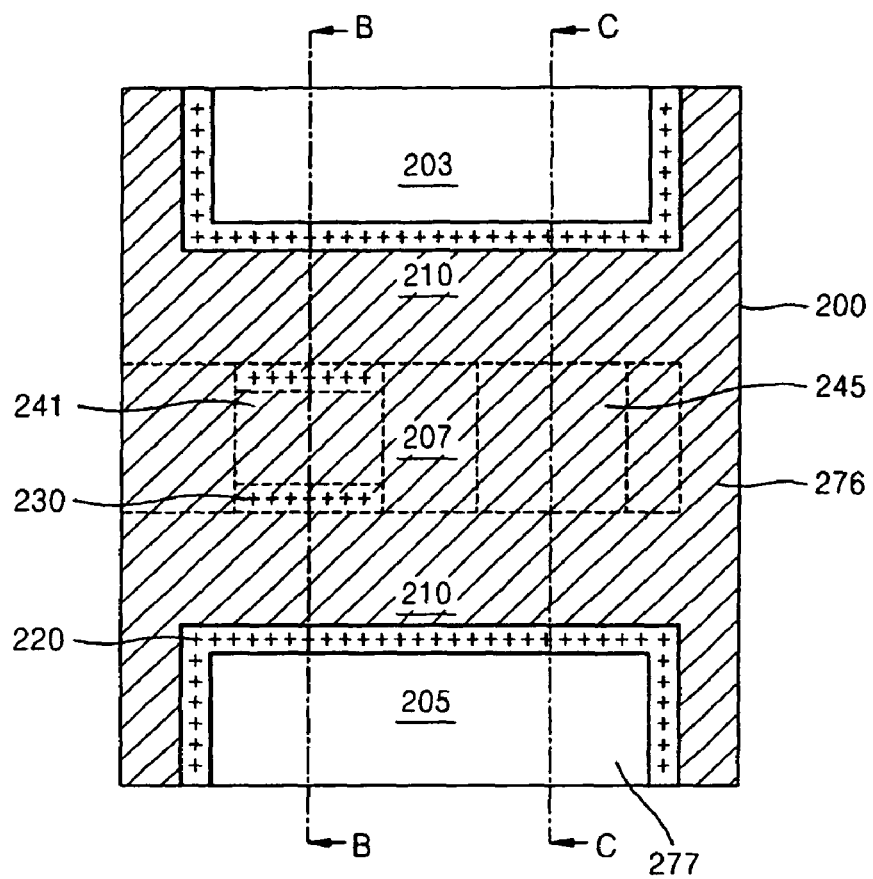
Figure 8B:
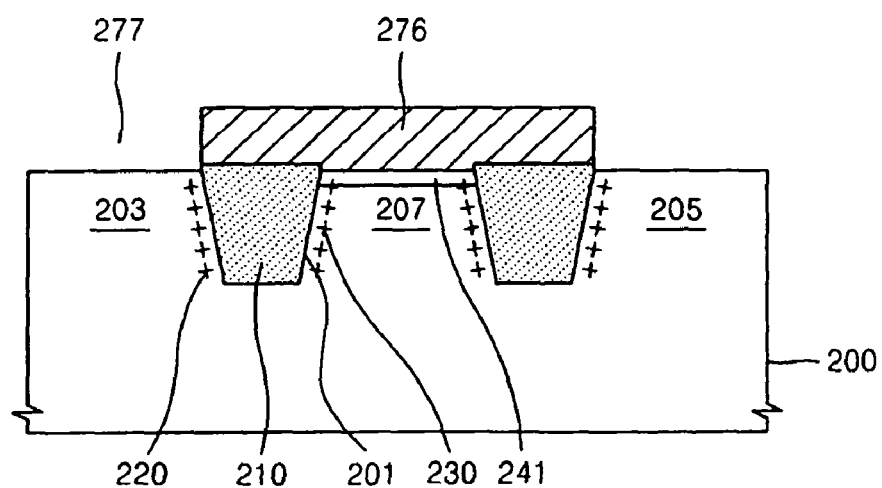
Figure 8C:
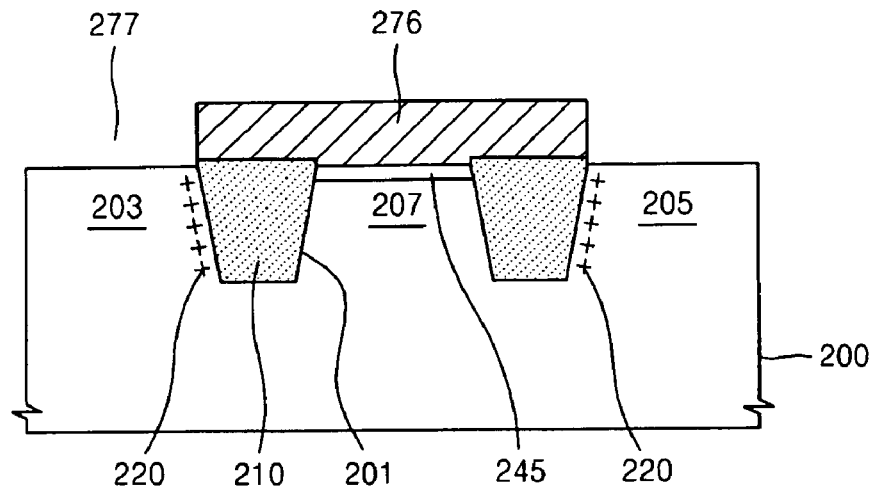
Figure 9A:
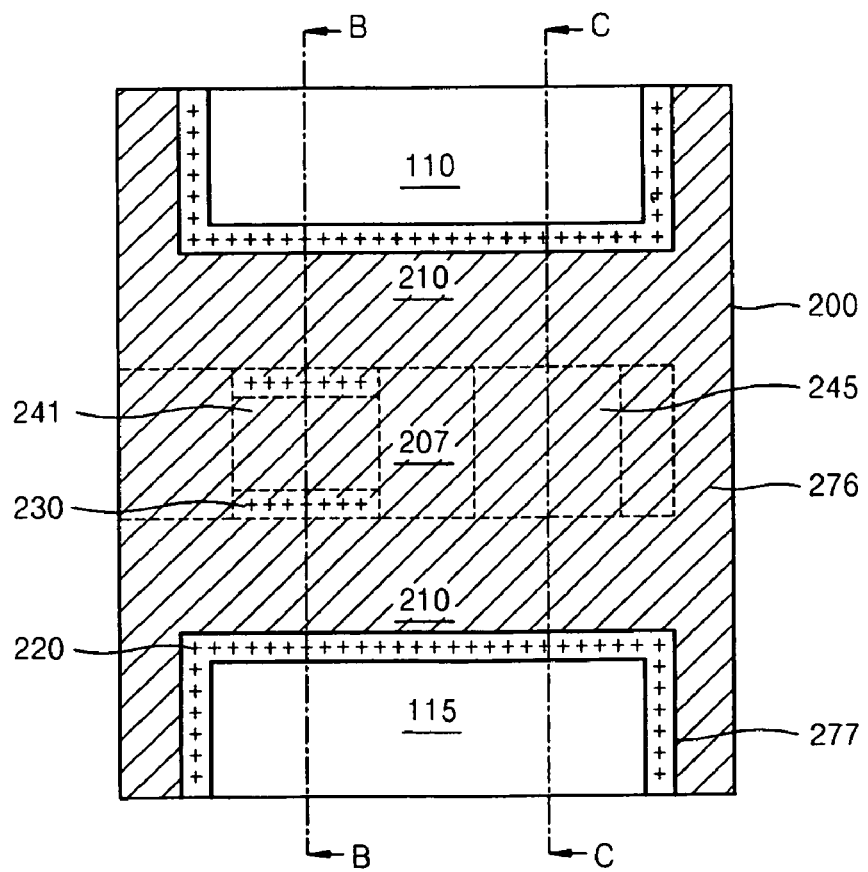
Figure 9B:
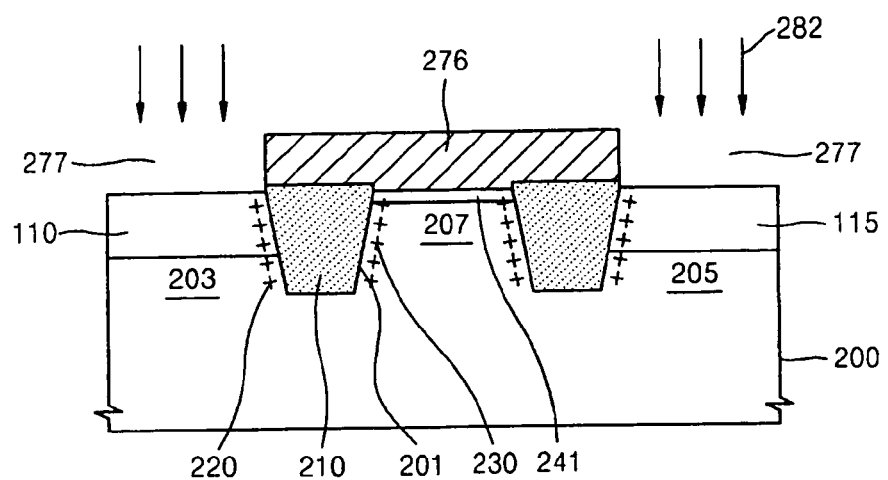
Figure 9C:
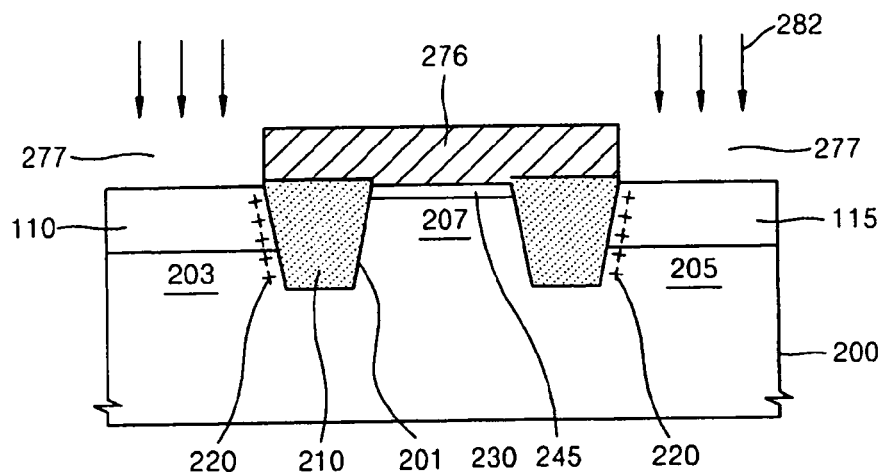

Referring to FIGS. 8A, 8B, and 8C, the third photosensitive film 274 is removed, and then a fourth photosensitive film 276 is deposited and patterned on the semiconductor substrate 200. The fourth photosensitive film 276 is patterned to form fourth openings 277 that expose the first and second active regions 203 and 205. Referring to FIGS. 9A, 9B, and 9C, an N-type dopant 282 is implanted into the exposed first and second active regions 203 and 205 to form the first and second photodiodes 110 and 115 with the fourth photosensitive film 276 being used as an implantation mask.

Figure 10A:
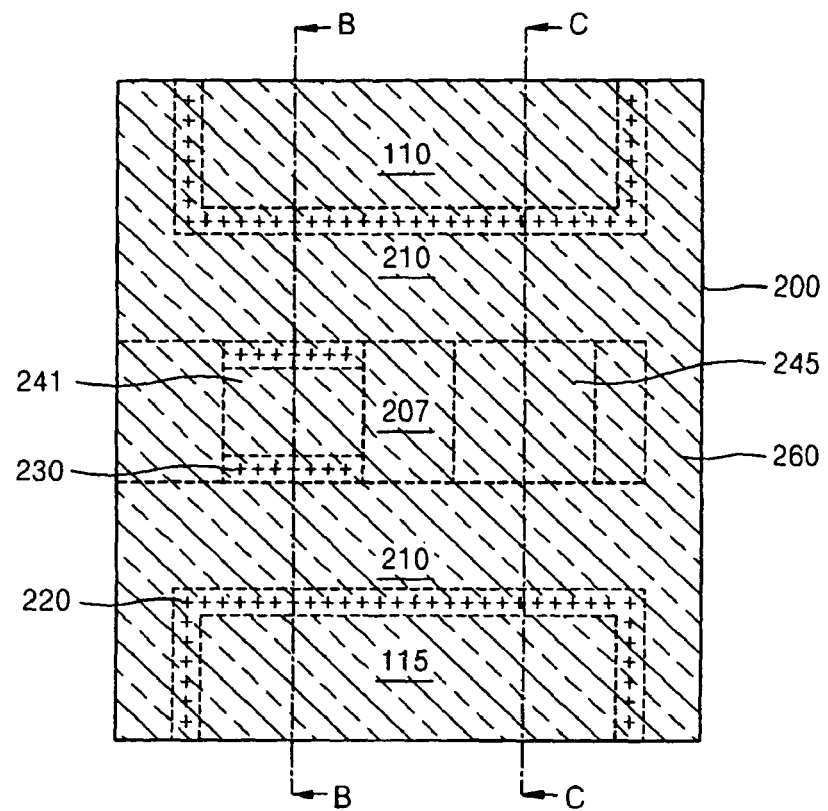
Figure 10B:
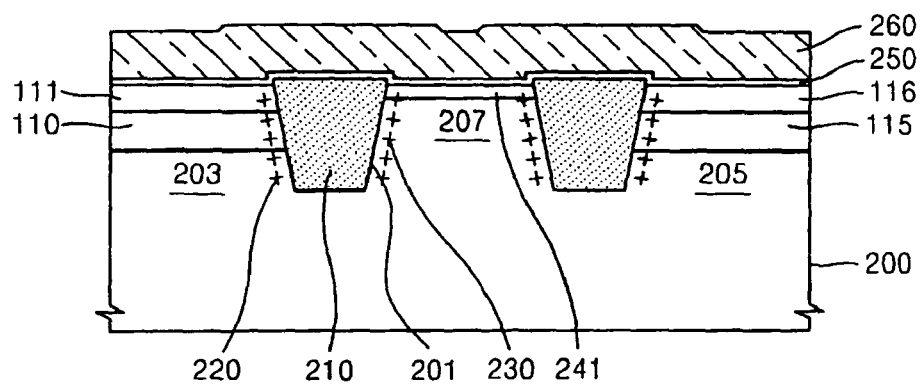
Figure 10C:
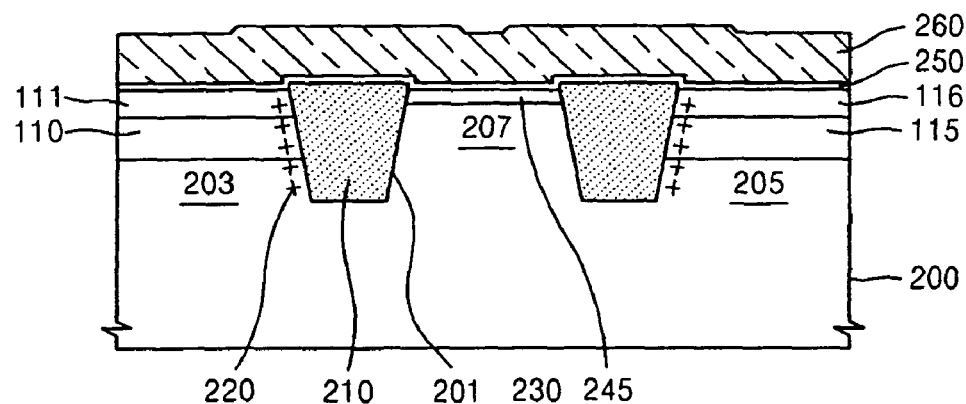

Referring to FIGS. 10A, 10B, and 10C, a P-type dopant is subsequently implanted into the exposed first and second active regions 203 and 205 to form photodiode pinning layers 111 and 116 on top of the photodiodes 110 and 115, respectively. Such a P-type dopant is implanted using the fourth photosensitive film 276 as an implantation mask.

Further referring to FIGS. 10A, 10B, and 10C, the fourth photosensitive film 276 is removed after formation of the photodiode pinning layers 111 and 116. Thereafter in FIGS. 10A, 10B, and 10C, an insulator film 250 is formed entirely on the semiconductor substrate 200, and a conductive film 260 is subsequently formed on the insulator film 250. The insulator film 250 is comprised of a thermal oxidation film, and the conductive film 260 is a polysilicon film, in an example embodiment of the present invention.

Figure 11A:
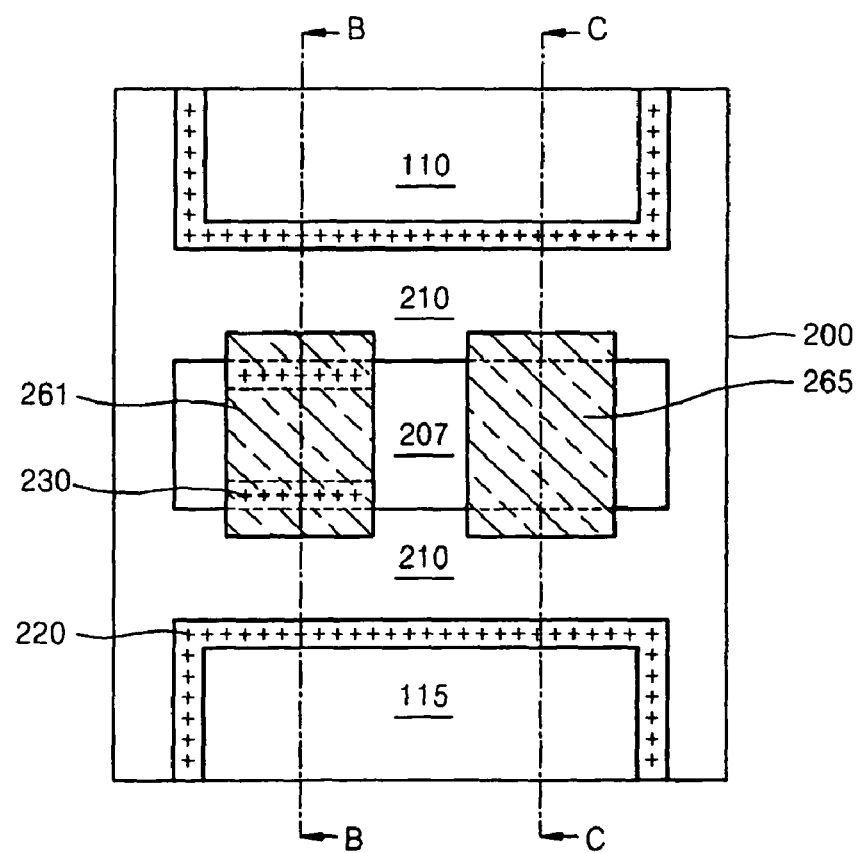
Figure 11B:
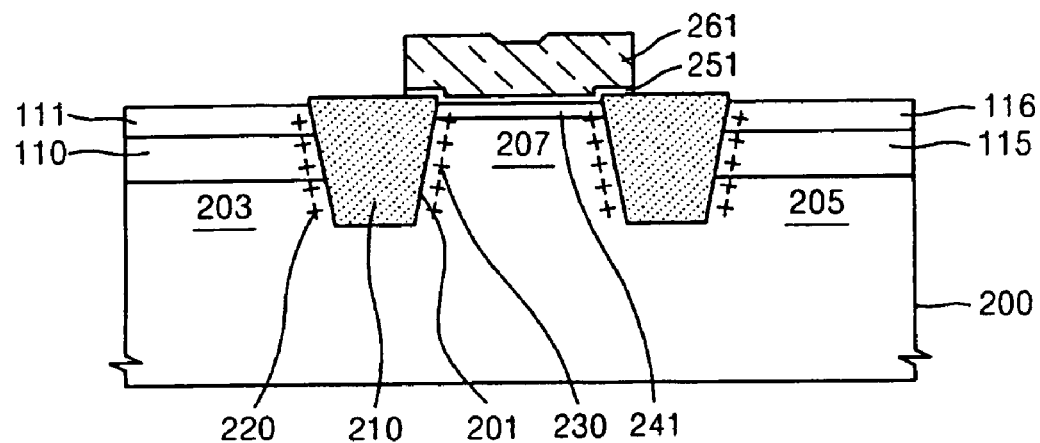
Figure 11C:
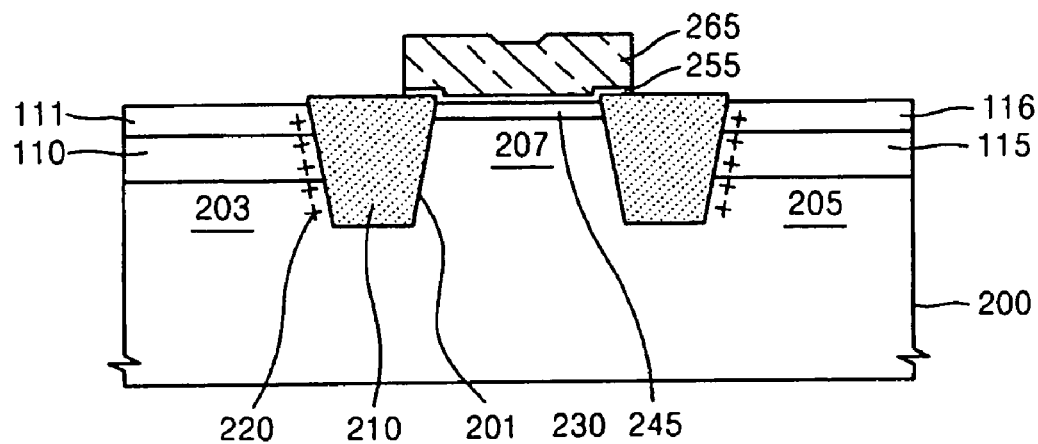

Referring to FIGS. 11A, 11B, and 11C, the insulator film 250 and the conductive film 260 are patterned to form a first gate electrode 261 and a first gate insulator 251 of the select transistor 160 over the channel region 241 in the third active region 207. Similarly, the insulator film 250 and the conductive film 260 are patterned to also form a second gate electrode 265 and a second gate insulator 255 of the drive transistor 150 over the channel region 245 in the third active region 207.

Figure 12A:
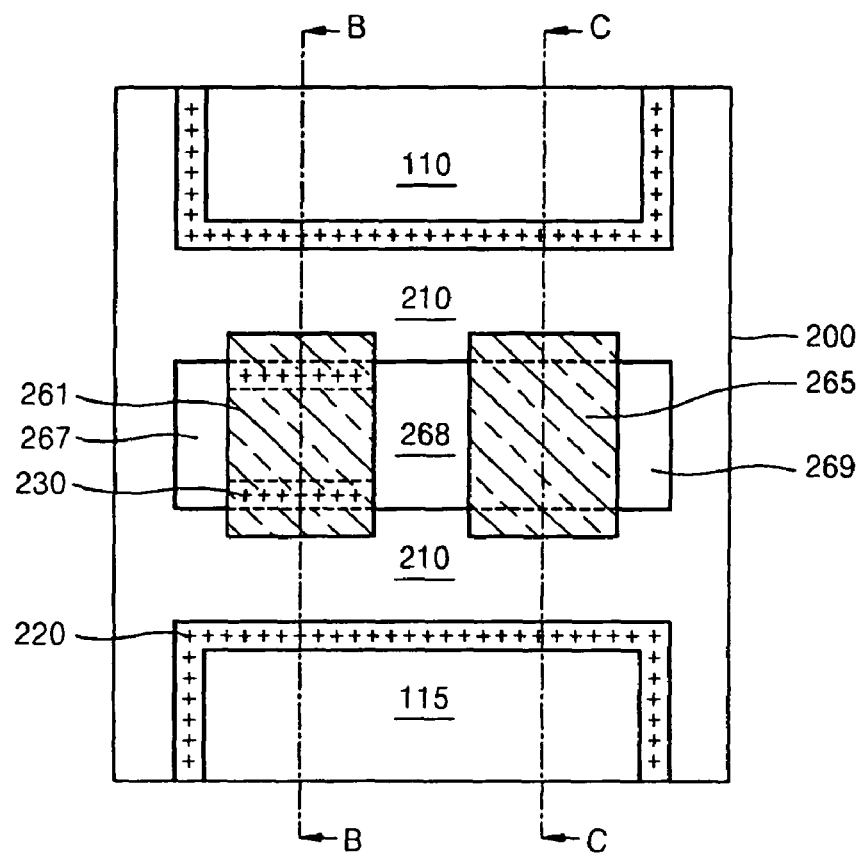
Figure 12B:
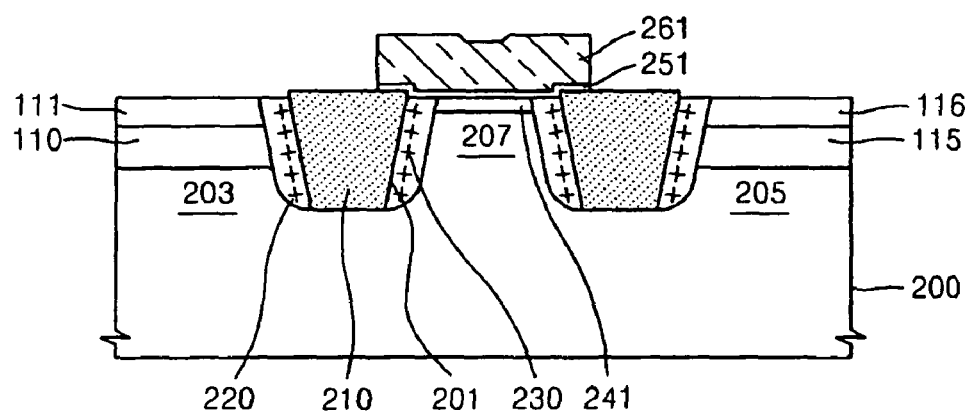
Figure 12C:
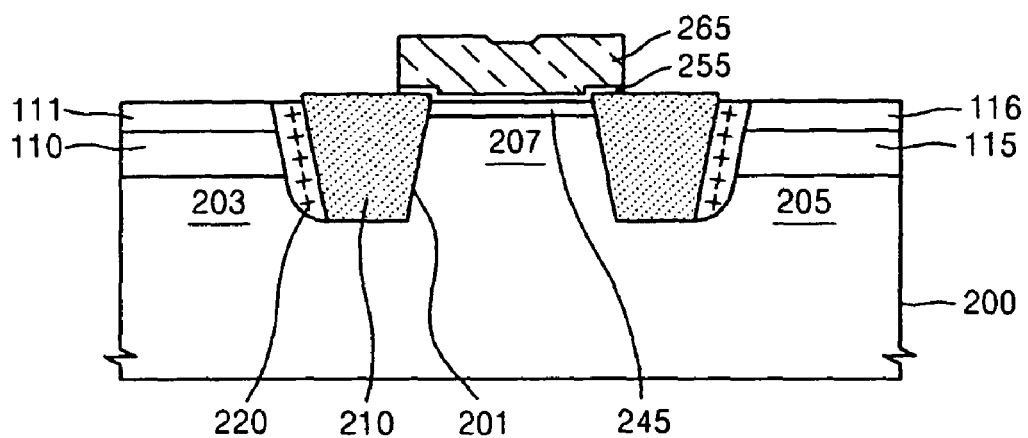

Referring to FIGS. 12A, 12B, and 12C, a fifth photosensitive film (not shown) is formed on the semiconductor substrate 200 including over the first and second gate electrodes 261 and 265. The fifth photosensitive film is patterned to form selective openings that expose portions of the third active region 207 to the sides of the first and second gate electrodes 261 and 265.

Using the patterned fifth photosensitive film as an implantation mask, an N-type dopant is implanted into such exposed portions of the third active region 207 to form drain/source regions 267, 268, and 269 to the sides of the first and second gate electrodes 261 and 265 for the select transistor 160 and the drive transistor 150. For example, a first drain/source region 267 functions as a drain of the select transistor 160. Additionally, a second drain/source region 268 functions as a source of the select transistor 160 and as a drain of the drive transistor 150. Furthermore, a third drain/source region 269 functions as a source of the drive transistor 150.

A thermal annealing process may be performed for diffusion of the dopant in the first, second, and third drain/source regions 267, 268, and 269. During such a thermal anneal, the dopants in the passivation regions 220 and the threshold voltage lowering region 230 are also activated and may be further diffused. Accordingly, the P-type dopants of the threshold voltage lowering region 230 diffuse to the channel region below the first gate 261 for increasing the concentration of the P-type dopant in addition to the P-type dopant of the channel ion implantation layer 241 for the select transistor 160.

Such increase of the P-type dopant decreases the magnitude of the respective threshold voltage of the select transistor 160 to be lower than the magnitude of the respective threshold voltage of the drive transistor 150. Note that no threshold voltage lowering region is formed for the drive transistor 150. Alternatively, for activating the P-type dopants of the threshold voltage lowering region 230 to diffuse into the channel region of the select transistor 160, a separate heat treatment process may be performed after the implantation process of FIGS. 5A, 5B, and 5B.

The photodiodes 110 and 115, the select transistor 160, and the drive transistor 150 are formed as the unit block 100 of a CMOS image sensor as illustrated in FIGS. 1A and 1B, in an embodiment of the present invention. Alternatively, concepts of the present invention may also be applied for a CMOS image sensor having a respective select transistor, a respective drive transistor, and a respective reset transistor formed for each photodiode.

Figure 13A:
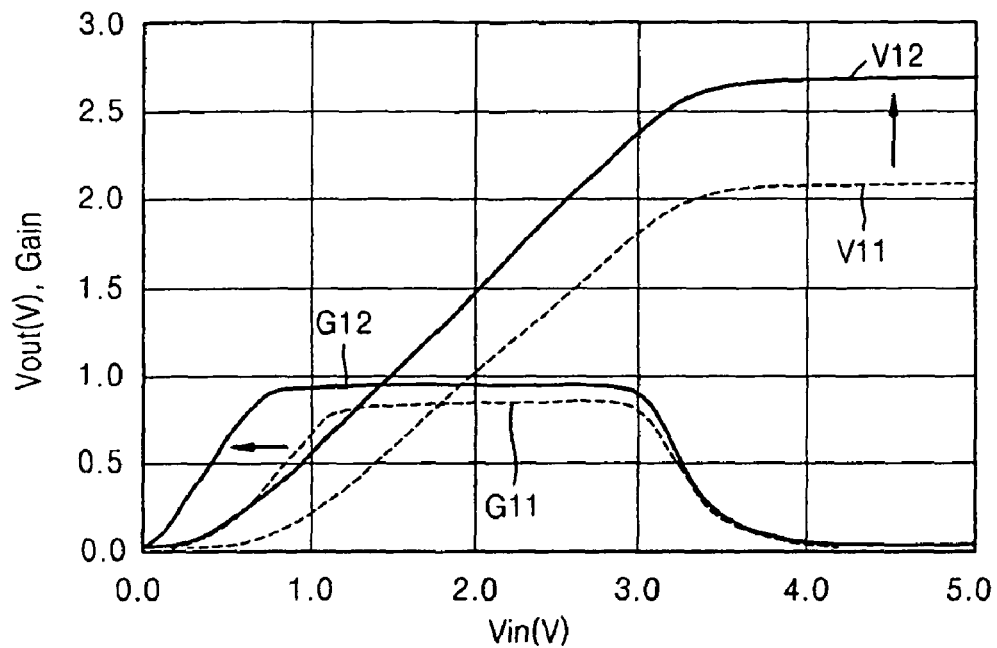
FIG. 13A is a graph illustrating an output voltage and a gain with respect to an input voltage for a conventional image sensor.
Figure 13B:
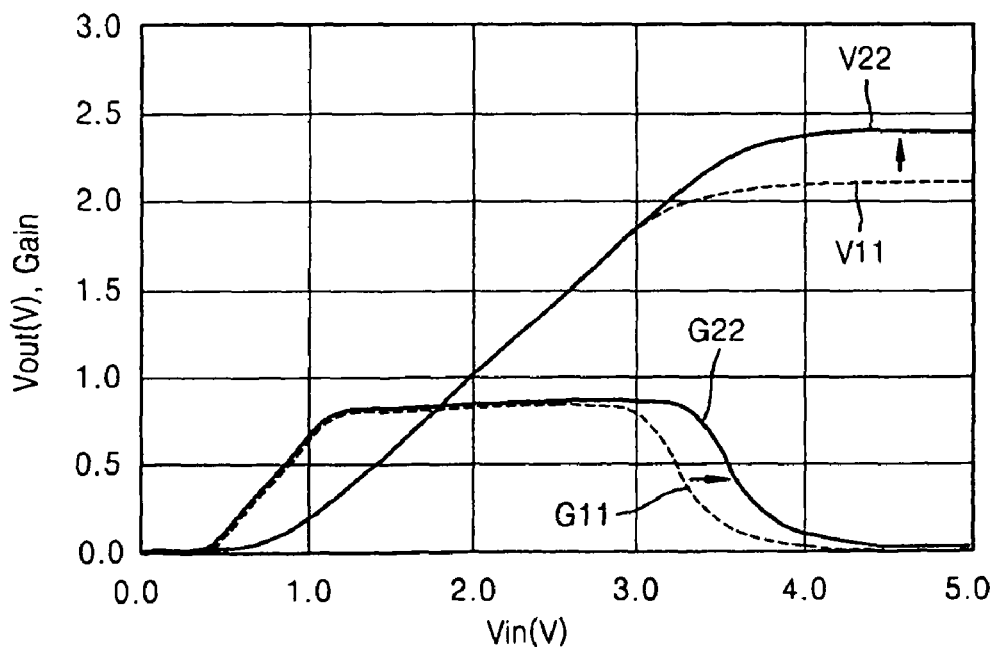
FIG. 13B is a graph illustrating an output voltage and a gain with respect to an input voltage of the image sensor according to an embodiment of the present invention.

In this manner, the magnitude of the respective threshold voltage of the select transistor 160 is lower than the magnitude of the respective threshold voltage of the drive transistor 150. Referring to FIG. 13B, a gain curve for the image sensor having such select and drive transistors 160 and 150 is widened at the higher voltage region because the voltage at the drain of the drive transistor 150 is increased with the lower threshold voltage of the select transistor 160.

Because the magnitude of the respective threshold voltage of the select transistor 160 is lower than the magnitude of the respective threshold voltage of the drive transistor 150, the output voltage Vout increases as the input voltage Vin increases for a higher range of the voltages Vin and Vout. Accordingly, the gain curve is changed from the curve G11 of FIG. 13A to the curve G22 of FIG. 13B with the wider high voltage region for improved spatial SNR of the image sensor.

In this manner, for adjusting the magnitude of the respective threshold voltage of the select transistor 160 to be lower than the magnitude of the respective threshold voltage of the drive transistor 150, the threshold voltage lowering region 230 is formed simultaneously with formation of the passivation regions 220 with implantation of the P-type dopant. Thus, an additional mask and implantation process is not required in the present invention for simplified and lower manufacturing cost.

While the present invention has been shown and described with reference to exemplary embodiments thereof, it will be understood by those of ordinary skill in the art that various changes in form and detail may be made herein without departing from the spirit and scope of the present invention, as defined by the following claims.

The present invention is limited only as defined in the following claims and equivalents thereof.

What is claimed is:

1. A method of fabricating an image sensor, comprising:
   forming an isolation structure for defining a first active region of a semiconductor substrate;
   forming a first transistor of a unit pixel in the first active region;
   forming a second transistor of the unit pixel in the first active region; and
   forming a threshold voltage lowering region in a portion of the semiconductor substrate near a portion of the isolation structure abutting the second transistor in the first active region,
   wherein the threshold voltage lowering region causes the second transistor to have a respective threshold voltage magnitude that is lower than for the first transistor,
   and wherein said threshold voltage lowering region is formed in a portion of said semiconductor substrate along a first side of a gate of said second transistor, and wherein any source/drain region of said second transistor is formed along a second side of said gate that is along a different direction from said first side of said gate.

2. The method of claim 1, wherein the first transistor is a drive transistor, and wherein the second transistor is a select transistor, and wherein said threshold voltage lowering region is formed along said first side of said gate that is perpendicular to said second side of said gate along which said source/drain region is formed.

3. The method of claim 2, further comprising:
   implanting a dopant for forming the threshold voltage lowering region in the semiconductor substrate near the portion of the isolation structure abutting the select transistor.

4. The method of claim 3, further comprising:
   forming an implantation mask such that the dopant is not implanted in the semiconductor substrate near a portion of the isolation structure abutting the drive transistor.

5. The method of claim 3, wherein the dopant is a P-type dopant when the drive transistor and the select transistor are NMOSFETs (N-channel metal oxide semiconductor field effect transistors).

6. The method of claim 3, wherein the dopant is an N-type dopant when the drive transistor and the select transistor are PMOSFETs (P-channel metal oxide semiconductor field effect transistors).

7. The method of claim 3, further comprising:
   forming said isolation structure to define a second active region of the semiconductor substrate;
   forming a photo conversion device of the unit pixel in the second active region; and
   forming a passivation region in the semiconductor substrate near a portion of the isolation structure abutting the second active region.

8. The method of claim 7, wherein the passivation region is formed simultaneously with the threshold voltage lowering region.

9. The method of claim 8, wherein the passivation region and the threshold voltage lowering region are formed simultaneously from said implantation of the dopant.

10. The method of claim 3, further comprising:
    implanting a channel dopant into channels of the select transistor and the drive transistor separately from the implantation of the dopant for forming the threshold voltage lowering region.

11. The method of claim 10, further comprising:
    forming a respective gate insulator and a respective gate electrode over each of the channels of the select transistor and the drive transistor; and
    forming drain/source regions beside the channels of the select transistor and the drive transistor;
    wherein the image sensor is a CMOS (complementary metal oxide semiconductor) image sensor.

12. The method of claim 1, further comprising:
  implanting a dopant for forming the threshold voltage lowering region in the semiconductor substrate near the portion of the isolation structure abutting the second transistor.

13. The method of claim 12, further comprising:
  forming an implantation mask such that the dopant is not implanted in the semiconductor substrate near a portion of the isolation structure abutting the first transistor.

14. The method of claim 12, wherein the dopant is a P-type dopant when the first and second transistors are NMOSFETs (N-channel metal oxide semiconductor field effect transistors).

15. The method of claim 12, wherein the dopant is an N-type dopant when the first and second transistors are PMOSFETs (P-channel metal oxide semiconductor field effect transistors).

16. The method of claim 12, further comprising:
  forming said isolation structure to define a second active region of the semiconductor substrate;
  forming a photo conversion device of the unit pixel in the second active region; and
  forming a passivation region in the semiconductor substrate near a portion of the isolation structure abutting the second active region.

17. The method of claim 16, wherein the passivation region is formed simultaneously with the threshold voltage lowering region.

18. The method of claim 17, wherein the passivation region and the threshold voltage lowering region are formed simultaneously from said implantation of the dopant.

19. The method of claim 12, further comprising:
  implanting a channel dopant into channels of the first and second transistors separately from the implantation of the dopant for forming the threshold voltage lowering region.

20. The method of claim 19, further comprising:
  forming a respective gate insulator and a respective gate electrode over each of the channels of the first and second transistors; and
  forming drain/source regions beside the channels of the first and second transistors.

* * * * *